United States Patent
Matsuura

(10) Patent No.: US 10,629,447 B2
(45) Date of Patent: Apr. 21, 2020

(54) PLASMA ETCHING METHOD

(71) Applicant: ZEON CORPORATION, Chiyoda-ku Tokyo (JP)

(72) Inventor: Go Matsuura, Tokyo (JP)

(73) Assignee: ZEON CORPORATION, Chiyoda-ku Tokyo (JP)

(*) Notice: Subject to any disclaimer, the term of this patent is extended or adjusted under 35 U.S.C. 154(b) by 22 days.

(21) Appl. No.: 16/081,939

(22) PCT Filed: Mar. 8, 2017

(86) PCT No.: PCT/JP2017/009332
§ 371 (c)(1),
(2) Date: Sep. 3, 2018

(87) PCT Pub. No.: WO2017/159512
PCT Pub. Date: Sep. 21, 2017

(65) Prior Publication Data
US 2019/0096689 A1 Mar. 28, 2019

(30) Foreign Application Priority Data
Mar. 17, 2016 (JP) .................. 2016-054317

(51) Int. Cl.
*H01L 21/3065* (2006.01)
*H01L 21/311* (2006.01)

(52) U.S. Cl.
CPC .. *H01L 21/30655* (2013.01); *H01L 21/31116* (2013.01); *H01L 21/3065* (2013.01)

(58) Field of Classification Search
CPC ........... H01L 21/3065; H01L 21/30655; H01L 21/311; H01L 21/3086; H01L 21/31116; H01L 21/32136
(Continued)

(56) References Cited

U.S. PATENT DOCUMENTS

| 5,501,893 A | 3/1996 | Laermer et al. |
| 2007/0000868 A1 | 1/2007 | Sakai |

(Continued)

FOREIGN PATENT DOCUMENTS

| DE | 4241045 C1 | 5/1994 |
| DE | 10246063 A1 | 4/2004 |

(Continued)

OTHER PUBLICATIONS

Apr. 4, 2017, International Search Report issued in the International Patent Application No. PCT/JP2017/009332.
(Continued)

*Primary Examiner* — Lan Vinh
(74) *Attorney, Agent, or Firm* — Kenja IP Law PC

(57) ABSTRACT

A plasma etching method includes: a deposition step of providing an atmosphere containing a first processing gas including at least one gas including either or both of a fluorine atom and a carbon atom and a second processing gas having a noble gas as a main component inside a processing vessel, and forming a thin film; and an etching step of providing an atmosphere containing at least the second processing gas inside the processing vessel and plasma etching a processing subject substrate. The deposition step and the etching step are switched between and implemented alternately. When an atmosphere containing the first processing gas and the second processing gas is provided inside the processing vessel in the deposition step, the atmosphere is configured to contain at least 2.4 times and not more than 3.1 times more fluorine atoms than carbon atoms by mass.

5 Claims, 1 Drawing Sheet

(58) Field of Classification Search
USPC ....... 438/706, 710, 712, 714, 717, 719, 723, 438/736, 780
See application file for complete search history.

(56) References Cited

U.S. PATENT DOCUMENTS

| | | | |
|---|---|---|---|
| 2008/0085605 A1* | 4/2008 | Negishi | H01L 21/31116 438/734 |
| 2009/0191711 A1* | 7/2009 | Rui | G03F 7/40 438/695 |
| 2009/0233450 A1* | 9/2009 | Sakao | H01L 21/3065 438/716 |
| 2010/0231657 A1 | 9/2010 | Takahashi | |
| 2010/0267241 A1 | 10/2010 | Riva | |
| 2011/0027999 A1 | 2/2011 | Sparks et al. | |
| 2011/0108861 A1 | 5/2011 | Smith et al. | |
| 2013/0023125 A1 | 1/2013 | Singh et al. | |
| 2015/0235861 A1* | 8/2015 | Mizuno | H01L 21/31116 438/702 |
| 2016/0005651 A1 | 1/2016 | Watanabe et al. | |

FOREIGN PATENT DOCUMENTS

| | | |
|---|---|---|
| EP | 2991103 A1 | 3/2016 |
| JP | 2010219153 A | 9/2010 |
| JP | 2013510445 A | 3/2013 |
| JP | 2014522104 A | 8/2014 |
| JP | 2015032597 A | 2/2015 |
| JP | 2016027594 A | 2/2016 |

OTHER PUBLICATIONS

Sep. 18, 2018, International Preliminary Report on Patentability issued in the International Patent Application No. PCT/JP2017/009332.

Sep. 17, 2019, the Extended European Search Report issued by the European Patent Office in the corresponding European Patent Application No. 17766513.0.

* cited by examiner

PLASMA ETCHING METHOD

TECHNICAL FIELD

The present disclosure relates to a plasma etching method and, in particular, to a plasma etching method by atomic layer etching (ALE).

BACKGROUND

In typical "plasma etching", fluorocarbons, inert gases, oxygen and the like are used as processing gases, and a high-frequency electric field is applied to such processing gases to cause a glow discharge and generate plasma. Etching is then performed by reacting reactive species in the plasma with a processing subject substrate that includes an etching target. In recent years, various plasma etching methods have been proposed in accompaniment to increasing demand for diversification of semiconductor device applications and refinement of etching patterns. Of these plasma etching methods, a technique referred to as atomic layer etching (hereinafter, also referred to as "ALE") that enables control of etching shape on the atomic layer level (i.e., on the order of angstroms) is attracting attention.

In plasma etching, a thin layer is deposited on a processing subject substrate and material at the surface of the processing subject substrate or the thin film is etched, it has generally been the case that thin film deposition and etching proceed in a substantially concurrent manner. On the other hand, in the aforementioned ALE method, various controls are performed such that a deposition step of depositing a thin film on a processing subject substrate and an etching step of etching by causing reactive species to collide with the processing subject substrate are switched between and implemented separately. For this reason, it has been possible to control etching shape at the atomic layer level through ALE as previously described.

Note that the thin film deposited in the deposition step may, depending on a component at the deposition location, function as a protective film that protects the processing subject substrate or function as an active film that contributes to etching of the processing subject substrate. For example, the processing subject substrate may include a processing target film that is to be etched to form a pattern and a non-processing target film that is to remain without being etched, and when a thin film is deposited on the non-processing target film, the deposited thin film may function as a protective film in an etching step, whereas when a thin film is deposited on the processing target film, the deposited thin film may function as an active film in an etching step.

However, one problem with ALE is that processing takes longer to complete than with a conventional plasma etching method because of the need to switch between deposition and etching steps. Increasing the etching rate of the etching step has been considered as a means of shortening the processing time, but this may lead to etching of a protective film or a non-processing target film that is not supposed to be etched. Etching of a non-processing target film or protective film makes it difficult to achieve sufficient refinement and high accuracy of an etching pattern.

Consequently, a technique has been proposed (for example, refer to PTL 1) that can inhibit etching of a non-processing target in ALE by using an inert gas that is excited to a metastable state (also referred to as a "metastable gas"). An apparatus described in PTL 1 enables etching of a processing subject substrate using a metastable gas while preventing plasma charged species generated by plasma excitation of an inert gas from reaching the processing subject substrate through a separating plate structure that can prevent movement of plasma charged species.

CITATION LIST

Patent Literature

PTL 1: JP 2014-522104 A

SUMMARY

Technical Problem

Demand for refinement of etching patterns has further increased in recent years, and this has been accompanied by the need for efficient manufacturing of such fine etching patterns. In order to obtain a fine etching pattern, it is preferable that processing targets such as an active film, a processing target film, and part of a substrate on which the processing target film is provided are etched as selectively as possible in the etching step. In other words, it is preferable that the etching selectivity ratio has a high value. However, in the case of the apparatus described in PTL 1, there is room for improvement in terms of improving manufacturing efficiency and etching selectivity ratio in a good balance.

Accordingly, an objective of the present disclosure is to provide a plasma etching method by ALE that enables both shortening of processing time and improvement of etching selectivity ratio.

Solution to Problem

The inventor conducted diligent investigation with the aim of solving the problems set forth above. Through this investigation, the inventor reached a new discovery that it is possible to both shorten processing time and improve etching selectivity ratio in a plasma etching method by ALE by using a processing gas that includes fluorine atoms and carbon atoms in a specific mass ratio, and in this manner completed the present disclosure.

Specifically, the present disclosure aims to advantageously solve the problems set forth above by disclosing a plasma etching method comprising: a step of placing a processing subject substrate inside a processing vessel; a deposition step of supplying, into the processing vessel, a first processing gas that includes at least one gas including either or both of a fluorine atom and a carbon atom and a second processing gas, differing from the first processing gas, that has a noble gas as a main component and may include a gas including either or both of a fluorine atom and a carbon atom to provide an atmosphere containing the first processing gas and the second processing gas inside the processing vessel, and forming a thin film on at least one surface of the processing subject substrate; and an etching step of providing an atmosphere containing at least the second processing gas inside the processing vessel and plasma etching the processing subject substrate on which the thin film has been formed, wherein the deposition step and the etching step are switched between and implemented alternately, and when an atmosphere containing the first processing gas and the second processing gas is provided inside the processing vessel in the deposition step, the atmosphere is configured to contain at least 2.4 times and not more than 3.1 times more fluorine atoms than carbon atoms by mass. By controlling the mass ratio of fluorine atoms and carbon atoms to within a specific range in a deposition step of a plasma etching method in which the deposition step and an etching step are switched between and implemented, it is possible to both shorten processing time and improve etching selectivity ratio.

The phrase "having a noble gas as a main component" as used in the present disclosure means that a noble gas is contained in a proportion of 99.00 volume % or more when the entire volume of the second processing gas is taken to be 100 volume %.

In the present disclosure, the masses of fluorine atoms and carbon atoms contained in an atmosphere containing first and second processing gases in a deposition step can be determined by, for example, measuring the contained mass of each atom for each processing gas in accordance with JIS K 0123, weighting each of these masses in accordance with the deposition ratio of each processing gas in the atmosphere to calculate the total amount of fluorine atoms and the total amount of carbon atoms in the atmosphere, and then dividing the total amount of fluorine atoms by the total amount of carbon atoms.

Also note that the term "processing time" as used in the present disclosure is the time required for a deposition step and an etching step to each be performed once.

In the presently disclosed plasma etching method, the first processing gas preferably includes at least one fluorocarbon gas. The inclusion of at least one fluorocarbon gas in the first processing gas enables even better shortening of processing time and improvement of etching selectivity ratio.

Moreover, in the presently disclosed plasma etching method, the at least one fluorocarbon gas is preferably octafluorocyclopentene gas. The inclusion of octafluorocyclopentene gas in the first processing gas enables even better shortening of processing time and improvement of etching selectivity ratio.

In the presently disclosed plasma etching method, supply of the first processing gas into the processing vessel may be stopped in switching from the deposition step to the etching step. By stopping the supply of the first processing gas into the processing vessel, it is possible to switch from the deposition step to the etching step.

In the presently disclosed plasma etching method, voltage applied to a region inside the processing vessel at a side of the processing subject substrate at which the thin film is not formed may be increased in the etching step relative to voltage applied to the same region in the deposition step. By increasing the voltage applied to this region in the processing vessel relative to the voltage applied to the same region in the deposition step, it is possible to switch from the deposition step to the etching step.

Furthermore, in the presently disclosed plasma etching method, when an atmosphere containing the first processing gas and the second processing gas is provided inside the processing vessel in the deposition step, a ratio of the noble gas in the atmosphere is preferably set as at least 10 parts by volume and not more than 10,000 parts by volume relative to 100 parts by volume of all gases including either or both of a fluorine atom and a carbon atom in the atmosphere. This is because the deposition step can be implemented with high efficiency when the ratio of the noble gas is within the range set forth.

Also, in the etching step of the presently disclosed plasma etching method, voltage applied to a region at a side of the processing subject substrate at which the thin film is not formed preferably has a peak-to-peak value of 1,600 V or less. This is because the etching step can be implemented with high efficiency when the peak-to-peak value of the applied voltage is within the range set forth above.

In the presently disclosed plasma etching method, it is preferable that the processing subject substrate includes a non-processing target film and a processing target film, and an etching ratio of the processing target film relative to the non-processing target film is 3.5 or more. This is because an etching selectivity ratio of the processing target film relative to the non-processing target film that is 3.5 or more is a good etching selectivity ratio.

In the present specification, the term "non-processing target film" refers to a target that should remain without being etched in an etching step and the term "processing target film" refers to a target that should be etched in an etching step.

Advantageous Effect

According to the present disclosure, it is possible to both shorten processing time and improve etching selectivity ratio.

DETAILED DESCRIPTION

Figure 1A:
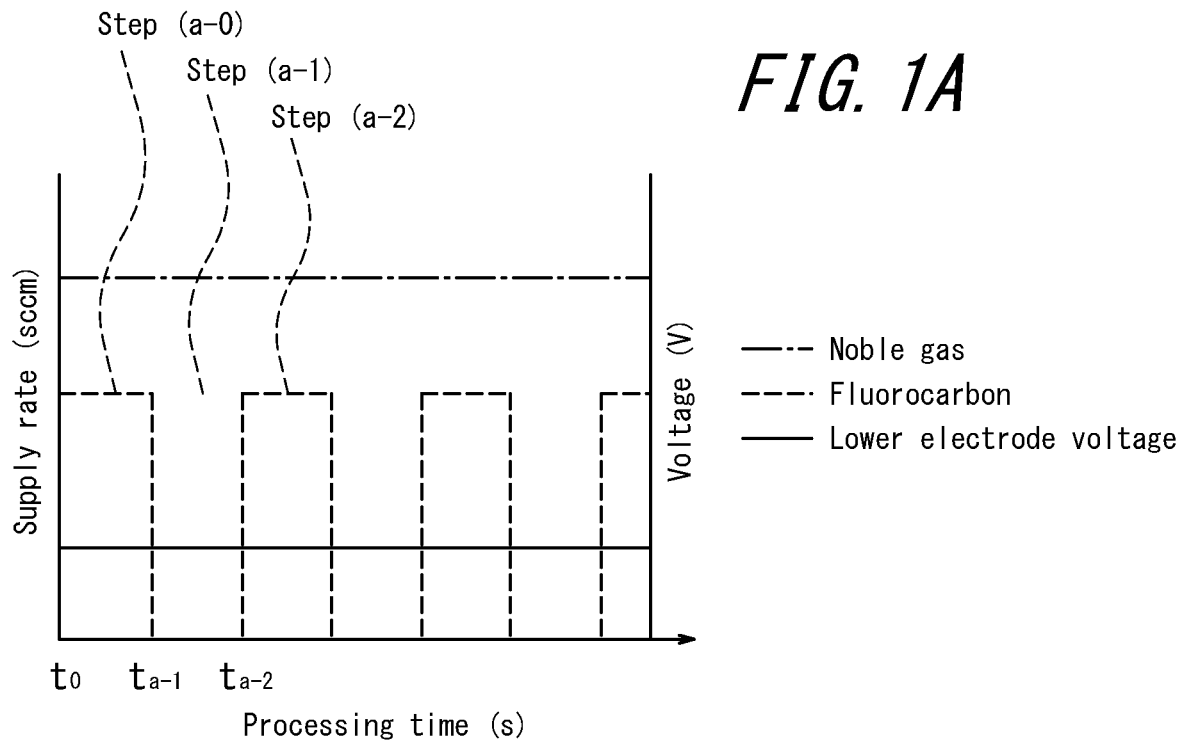
FIG. 1A illustrates variation of various gases and voltage in switching between a deposition step and an etching step by a gas pulse method.

The following provides a detailed description of embodiments of the present disclosure. A presently disclosed plasma etching method can be used in a manufacturing process of a semiconductor device without any specific limitations.

(Plasma etching method)

The presently disclosed plasma etching method includes: a step of placing a processing subject substrate inside a processing vessel (preparation step); a deposition step of supplying, into the processing vessel, a first processing gas that includes at least one gas including either or both of a fluorine atom and a carbon atom and a second processing gas, differing from the first processing gas, that has a noble gas as a main component and may include a gas including either or both of a fluorine atom and a carbon atom to provide an atmosphere containing the first processing gas and the second processing gas inside the processing vessel, and forming a thin film on at least one surface of the processing subject substrate; and an etching step of providing an atmosphere containing at least the second processing gas inside the processing vessel and plasma etching the processing subject substrate on which the thin film has been formed. One feature of the presently disclosed plasma etching method is that the deposition step and the etching step are switched between and implemented alternately. Another feature of the presently disclosed plasma etching method is that when an atmosphere containing the first processing gas and the second processing gas is provided inside the processing vessel in the deposition step, the atmosphere is configured to contain at least 2.4 times and not more than 3.1 times more fluorine atoms than carbon atoms by mass. By setting the atmosphere containing the first and second processing gases in the processing vessel in the deposition step such that the atmosphere satisfies this condition, it is possible to both shorten processing time and improve etching selectivity ratio.

The following describes each step in detail.

(Preparation step)

In the preparation step, the processing subject substrate is placed inside the processing vessel. Firstly, it is preferable that the inside of the processing vessel is placed in a vacuum state through pressure reduction in the preparation step. The processing vessel may be any processing vessel that can typically be used in plasma etching without any specific limitations and may, for example, be a dry etching chamber or the like. For example, the processing vessel may include a first gas supply port for supplying the first processing gas, a second gas supply port for supplying the second processing gas, an electrode configured to allow placement of the processing subject substrate, and an exhaust port formed such as to allow discharging of gas present inside the processing vessel. The processing vessel may also include, without any specific limitations, a typical plasma generator such as a helicon wave plasma generator, a high-frequency induction plasma generator, a parallel plate plasma generator, a magnetron plasma generator, or a microwave plasma generator. The plasma generator is preferably a parallel plate plasma generator, a high-frequency induction plasma generator, or a microwave plasma generator. This is because high-density region plasma can easily be generated. The processing vessel also includes at least one electrode positioned at any location in a region that, in terms of the thickness direction of the processing subject substrate, is at the opposite side of the processing subject substrate relative to a processing subject surface side thereof. By applying a specific voltage to the aforementioned at least one electrode, ions are caused to collide with the processing subject surface of the processing subject substrate to thereby perform etching.

The following provides an explanation for a case in which the processing vessel is a dry etching chamber that includes a parallel plate plasma generator. The parallel plate plasma generator includes an upper electrode for generating plasma inside the processing vessel and a lower electrode that is an electrode that can generate an electric field in a region at a side of the processing subject substrate at which a thin film is not formed. The processing subject substrate may be any substrate that can be used in plasma etching without any specific limitations. For example, the processing subject substrate may include a glass substrate, a monocrystalline silicon wafer, or a gallium arsenide substrate. Moreover, the processing subject substrate may, for example, include a silicon nitride film, a silicon oxide film, and/or an organic film formed, as necessary, on a monocrystalline silicon wafer. In other words, the processing subject substrate may be a substrate that includes these processing targets and/or non-processing targets.

The temperature of the processing subject substrate in the preparation step is preferably −50° C. or higher, more preferably −20° C. or higher, and even more preferably 0° C. or higher, and is preferably +120° C. or lower, more preferably +100° C. or lower, and even more preferably +80° C. or lower. The temperature of the processing subject substrate can be controlled, for example, using a cooling apparatus and a cooling gas such as helium gas.

(Deposition Step)

In the deposition step, the first processing gas including at least one gas that includes either or both of a fluorine atom and a carbon atom and the second processing gas, differing from the first processing gas, that has a noble gas as a main component and may include a gas including either or both of a fluorine atom and carbon atom are supplied, and a thin film is formed on at least one surface of the processing subject substrate. In the following steps, the pressure inside the processing apparatus is preferably set at a specific pressure that allows plasma generation, such as a pressure within a range of 1 Pa to 13 Pa, while the first and second processing gases are both being supplied into the processing vessel or when the second processing gas is being supplied into the processing vessel without supply of the first processing gas.

In the present specification, no specific limitations are placed on the "forming" of a thin film so long as a film that covers at least part of at least one surface of the processing subject substrate is formed. For example, this may refer to formation of a film by forming a polymer through polymerization of a component of the first processing gas and depositing the polymer on the surface of the processing subject substrate. The processing subject substrate may, for example, be placed on a sample stage provided inside the processing vessel, and the "one surface" of the processing subject substrate on which a thin film may be formed may be a surface at a side of the processing subject substrate that is not in contact with the sample stage. It should be noted that the thin film is not limited to being formed only on one surface of the processing subject substrate and may be formed at any location so long as it is a part of the processing subject substrate that is not in contact with the sample stage or the like. For example, a thin film may also be formed on a side surface of the processing subject substrate. In the present specification, the phrase "on at least one surface of the processing subject substrate" is inclusive of a case in which a thin film is formed directly on one surface of the processing subject substrate and also of a case in which a thin film is formed on a silicon nitride film, silicon oxide film, and/or organic film that are formed on at least one surface of the processing subject substrate as necessary. Moreover, a thin film that is deposited on a non-processing target such as a silicon film, a silicon nitride film, or an organic film functions as a protective film, whereas a thin film that is deposited on a processing target such as a silicon oxide film functions as an active film and contributes to etching in a subsequent step by causing a surface reaction with the silicon oxide film.

<Mass Ratio of Fluorine Atoms and Carbon Atoms Contained in Processing Gas>

As previously explained, a feature of the atmosphere containing the first and second processing gases in the deposition step is that at least 2.4 times and not more than 3.1 times more fluorine atoms are contained than carbon atoms by mass. Note that although gases other than the first and second processing gases may also be supplied into the processing vessel as processing gases as subsequently described, these other gases preferably do not include gases that include either or both of a fluorine atom and a carbon atom. In a case in which such other gases contain a gas that includes either or both of a fluorine atom and a carbon atom, the gas including either or both of a fluorine atom and a carbon atom among these other gases is considered to be included in the first processing gas in the present disclosure, and is also included in calculation of the masses of fluorine atoms and carbon atoms in the atmosphere containing the first and second processing gases.

The content ratio of fluorine atoms and carbon atoms in the atmosphere inside the processing vessel that contains the first and second processing gases in the deposition step is normally reflected in the content ratio of fluorine atoms and carbon atom in the formed thin film. A larger content of carbon atoms in the thin film improves etching resistance of the thin film. Excessively high etching resistance may make it difficult to etch a processing target film in the etching step. On the other hand, a large content of fluorine atoms in the thin film reduces etching resistance of the thin film and facilitates etching of the thin film. If a thin film that is deposited on a non-processing target film and is intended to function as a protective film is easily etched, the etching selectivity ratio may decrease as a result of the non-processing target film being etched. Moreover, if fluorine content in the atmosphere containing the first and second processing gases is high, the rate of plasma polymerization decreases, active film formation becomes inadequate, and etching also proceeds in the deposition step. Based on the above points, the inventor discovered that by adopting an atmosphere containing the first and second processing gases that satisfies the aforementioned condition in the deposition step, a thin film having appropriate etching resistance can be efficiently formed.

In a conventional etching method, deposition of a thin film on a processing subject substrate and etching of the surface of the processing subject substrate occur in one step as previously explained. Consequently, in a situation in which the formation rate of a thin film is faster than the etching rate, thickening of a thin film that is intended to function as an active film may occur, and etching may not proceed. For this reason, oxygen gas is generally added to processing gas that is supplied into a processing vessel in a conventional etching method in order to adjust the rate of thin film formation and adjust the thickness of a thin film that is intended to function as an active film. The addition of oxygen reduces the polymerization rate by causing $CF_x$ (x=1, 2, 3) that acts as a precursor for polymerization to be discharged from the reaction system in the form of $COF_2$. Therefore, an equivalent amount of oxygen or nitrogen is mixed with processing gas supplied into a processing vessel in a conventional etching method so as to reduce the rate of thin film polymerization to a lower level than the etching rate, and maximize the etching selectivity ratio of a processing target film relative to a non-processing target film. Herein, the term "equivalent amount" refers an amount of oxygen or nitrogen that is more than 50 parts by volume and not more than 300 parts by volume when the total amount of gas including either or both of a fluorine atom and a carbon atom that is contained in the atmosphere containing the first and second processing gases is taken to be 100 parts by volume. However, when an equivalent amount of oxygen is mixed into the processing gas, it is difficult for the composition of a thin film formed in the deposition step to directly reflect the content ratio of fluorine atoms and carbon atoms in the processing gas because $CF_x$ is discharged from the system through reaction with oxygen. For this reason, it has not been possible to efficiently form a thin film having appropriate etching resistance in a conventional etching method by adjusting the content ratio of fluorine atoms and carbon atoms in an atmosphere containing first and second processing gases as in the present disclosure.

The ratio of fluorine atoms and carbon atoms in the atmosphere containing the first and second processing gases may be adjusted to within the range set forth above using one or more gases that include either or both of a fluorine atom and a carbon atom. More specifically, one or more fluorocarbon gases each having a ratio of fluorine atoms and carbon atoms that is within the range set forth above may be used, a mixture of fluorocarbon gases each having a ratio of fluorine atoms and carbon atoms that is not within the range set forth above may be used, a mixture of gases each including a fluorine atom or a carbon atom may be used, or any combination thereof may be used as gases included in the first and second processing gases.

<First Processing Gas>

The first processing gas preferably contains at least 2.4 times and not more than 3.1 times more fluorine atoms than carbon atoms by mass. Moreover, the first processing gas more preferably contains at least 2.5 times and not more than 3.0 times more fluorine atoms than carbon atoms by mass.

[Fluorocarbon Gases]

The first processing gas preferably includes at least one fluorocarbon gas. Examples of fluorocarbon gases that may be used include fluorocarbon gases having a content ratio of fluorine atoms and carbon atoms that is within the range set forth above (hereinafter, also referred to as "first fluorocarbon gases") and fluorocarbon gases having a content ratio of fluorine atoms and carbon atoms that is not within the range set forth above (hereinafter, also referred to as "second fluorocarbon gases").

[[First Fluorocarbon Gases]]

Examples of first fluorocarbon gases having an F/C mass ratio of at least 2.4 and not more than 3.1 include, but are not specifically limited to, compounds represented by a molecular formula $C_5F_8$ such as 1,2,3,3,4,4,5,5-octafluorocyclopentene, octafluoro-1,4-pentadiene, octafluoro-1,3-pentadiene, and 1,1,1,4,4,5,5,5-octafluoro-2-pentyne; compounds represented by a molecular formula $C_5F_9$ such as 1,1,1,3,4,4,5,5,5-nonafluoro-2-pentene; compounds represented by a molecular formula $C_4HF_7$ such as 1,1,2,2,3,3,4-heptafluorocyclobutane and 1,1,1,3,4,4,4-heptafluoro-2-butene; and compounds represented by a molecular formula $C_3HF_5$ such as 1,2,3,3,3-pentafluoropropene. One of these compounds may be used individually, or two or more of these compounds may be used as a mixture. Of these compounds, octafluorocyclopentene compounds represented by a molecular formula $C_5F_8$ are preferable, and 1,2,3,3,4,4,5,5-octafluorocyclopentene is particularly preferable.

[[Second Fluorocarbon Gases]]

Examples of second fluorocarbon gases that do not have an F/C mass ratio of at least 2.4 and not more than 3.1 include, but are not specifically limited to, tetrafluoromethane ($CF_4$); hexafluoroethane ($C_2F_6$); octafluoropropane ($C_3F_8$); fluoromethane ($CH_3F$); difluoromethane ($CH_2F_2$); trifluoromethane ($CHF_3$); and compounds represented by a molecular formula $C_4F_6$ such as 1,2,3,3,4,4-hexafluoro-1-cyclobutene, 1,1,2,3,4,4-hexafluoro-1,3-butadiene, 1,1,1,4,4,4-hexafluoro-2-butyne; octafluorocyclobutane; 1,3,3,4,4,5,5-heptafluorocyclopentene; and 1,1,2,3,4,5,5-heptafluoro-1,3-pentadiene. One of these compounds may be used individually, or two or more of these compounds may be used as a mixture.

[Gases Including Fluorine Atom or Carbon Atom]

Examples of gases other than fluorocarbon gases that include a fluorine atom or a carbon atom include sulfur hexafluoride, tetrachloromethane, and hydrocarbons. One of these compounds may be used individually, or two or more of these compounds may be used as a mixture.

<Second Processing Gas>

The second processing gas is a different gas to the first processing gas. The second processing gas has a noble gas as a main component and may include a gas that includes either or both of a fluorine atom and a carbon atom. The second processing gas is required to include the noble gas in a proportion of 99.00 volume % or more, and preferably includes the noble gas in a proportion of 99.02 volume % or more, more preferably 99.50 volume % or more, and even more preferably 100.00 volume %. Examples of components other than the noble gas that may be included in the second processing gas include, besides gases including either or both of a fluorine atom and a carbon atom such as described above (i.e., the first fluorocarbon gases, second fluorocarbon gases, and gases including a fluorine atom or a carbon atom listed in relation to the first processing gas), impurities that may be unavoidably mixed in. These may be impurities that are unavoidably mixed in such as nitrogen, carbon, and water vapor.

By using the second processing gas having a noble gas as a main component in combination with the first processing gas in the deposition step, it is possible adjust the concentration inside the processing vessel of a fluorocarbon gas and/or gas including a fluorine atom or a carbon atom that may be used in thin film formation. The noble gas can be selected from helium, neon, argon, krypton, and xenon without any specific limitations. One of these noble gases may be used individually, or two or more of these noble gases may be used as a mixture. The content ratio of gas including either or both of a fluorine atom and a carbon atom in the second processing gas is required to be a low ratio that does not cause loss of the effects of plasma etching according to the present disclosure. Specifically, the content ratio of gases including either or both of a fluorine atom and a carbon atom may be less than 0.08 volume %. However, for the sake of clarity of explanation, it is assumed that the second processing gas does not include a gas that includes either or both of a fluorine atom and a carbon atom in the subsequent description of the mixing ratios of various gases. In other words, the description in the following "Mixing ratios" section assumes that the first processing gas satisfies a condition of containing at least 2.4 times and not more than 3.1 times more fluorine atoms than carbon atoms by mass (hereinafter, also referred to as "condition A").

On the other hand, in a situation in which the second processing gas does include a gas including either or both of a fluorine atom and a carbon atom, the total amount of "gas including either or both of a fluorine atom and a carbon atom" is the total amount of such gas contained in the atmosphere containing the first and second processing gases. The total amount may be confirmed, for example, by directly analyzing the atmosphere inside the etching processing vessel by GC/MS or the like, or by individually analyzing gases of each supplied gas source by GC/MS or the like, and weighting with the supplied gas flow rate from each gas source to calculate the total of the obtained components.

<Other Gases>

Other gases that do not include fluorine atoms and carbon atoms may additionally be used. For example, oxygen gas may be used in addition to the first and second processing gases set forth above in the deposition step. Moreover, a small amount of nitrogen gas or the like may be used in the deposition step so long as the effects of the presently disclosed plasma etching method are not lost.

<Mixing Ratios>
[Mixing Ratio of Gases in First Processing Gas]

Gas included in the first processing gas may be a gas that comprises 100 volume % of any of the first fluorocarbon gases set forth above or may be a gas obtained by selecting a plurality of gases from the first fluorocarbon gases, the second fluorocarbon gases, and/or the gases including a fluorine atom or a carbon atom set forth above, and then mixing these gases in an appropriate ratio such as to satisfy condition A.

[Mixing Ratio of First and Second Processing Gases]

The mixing ratio of the first processing gas and the second processing gas in the deposition step is set such that the mixing ratio of the noble gas that is included in the second processing gas relative to 100 parts by volume of the at least one gas including either or both of a fluorine atom and a carbon atom that is included in the first processing gas is preferably 10 parts by volume or more, more preferably 20 parts by volume or more, and even more preferably 50 parts by volume or more, and is preferably 10,000 parts by volume or less, more preferably 9,000 parts by volume or less, even more preferably 8,000 parts by volume or less, further preferably 5,000 parts by volume or less, and even further preferably 3,000 parts by volume or less. When the first and second processing gases are used in combination such that the ratio of noble gas is at least any of the lower limits set forth above, excessive increase in the rate of thin film formation and contamination of the inside of the processing vessel due to generation of dust or the like inside the processing vessel can be inhibited. Moreover, setting the ratio of noble gas as not more than any of the upper limits set forth above allows efficient thin film formation in the deposition step.

[Mixing Ratio of Other Gases]

In a case in which oxygen gas is used, the mixing ratio of oxygen gas is preferably 50 parts by volume or less, and more preferably 30 parts by volume or less when the total amount of gas including either or both of a fluorine atom and a carbon atom in the first processing gas is taken to be 100 parts by volume. When the oxygen content of the atmosphere inside the processing vessel during the deposition step is within any of the ranges set forth above, the rate of thin film formation in the deposition step can be set within an appropriate range.

Note that the gases set forth above are normally each independently filled into container such as a gas cylinder, transported, and then installed in connection with the processing vessel. The deposition step can then be carried out by opening valves of the gas cylinders or the like so as to introduce the gases into the processing vessel in specific proportions.

<Lower Electrode Voltage>

In the deposition step, plasma is generated by a common method such as by glow discharge to cause a polymerization reaction between molecules contained in the atmosphere inside the processing vessel, and thereby form a polymer that is deposited on the processing subject substrate to form a film. In a situation in which the upper electrode of a parallel plate plasma generator is 60 MHz, the lower electrode of the parallel plate plasma generator is 2 MHz, and the separation between these electrodes is 35 mm, power supplied to the upper electrode should be sufficient for causing a glow discharge or the like and may, for example, be at least 100 W and not more than 2,000 W. On the other hand, voltage applied to the lower electrode preferably has a peak-to-peak value of 2,000 V or less, and more preferably 1,600 V or less. When the voltage applied to the lower electrode in the deposition step is not more than any of the upper limits set forth above, film formation can be promoted.

(Etching Step)

In the etching step, an atmosphere containing at least the second processing gas is provided in the processing vessel, and the processing subject substrate on which a thin film has been formed is plasma etched. In order to obtain a fine etching pattern, it is preferable that processing targets such as an active film, a processing target film, and part of the substrate on which the processing target film is provided are etched as selectively as possible in the etching step. When the "selectivity ratio" in the etching step is high, these processing targets can be selectively etched. The term "selectivity ratio" as used in the present specification refers to a value obtained by dividing the amount of a processing target that is etched in an etching step by the amount of a non-processing target that is etched in the etching step. The value of the "selectivity ratio" increases as the etched amount of non-processing target decreases and/or the etched amount of processing target increases. Conversely, the value of the "selectivity ratio" decreases as the etched amount of non-processing target increases and/or the etched amount of processing target decreases. The etched amount of non-processing target is ideally zero. In such a case, the "selectivity ratio" cannot be calculated because it is necessary to divide by zero. Moreover, in a case in which a protective film is deposited on a non-processing target and this protective film remains on the substrate even after the etching step, the etched amount of non-processing target may be a negative value. Accordingly, when the etched amount of non-processing target is zero or less in the present specification, the etching selectivity ratio is considered to be extremely good and is taken to be infinitely large.

The etching selectivity ratio of a processing target film relative to a non-processing target film in the presently disclosed plasma etching method is preferably 3.5 or more. The processing target film may be a silicon oxide film, and the non-processing target film may be a silicon film, a silicon nitride film, an organic film, or the like. In a situation in which a single processing subject substrate includes more than one non-processing target film, it is preferable that when an etching selectivity ratio is calculated relative to each of the non-processing target films, a smallest value among the obtained etching selectivity ratios is 3.5 or more. The term "silicon film" as used in the present specification refers to a film formed from monocrystalline silicon or polysilicon. Moreover, the term "silicon oxide film" as used in the present specification refers to a film formed from an oxygen atom-containing silicon compound such as $SiO_2$, SiOC, or SiOCH. Furthermore, the term "silicon nitride film" as used in the present specification refers to a film formed from a nitrogen atom-containing silicon compound such as $Si_3N_4$ (SiN), SiCN, or SiBCN. Also, the term "organic film" as used in the present specification refers to a film having carbon as a main component. Note that "having carbon as a main component" means that the proportion in which carbon is contained in a material forming the film is more than 50 mass %. Specifically, this refers to a film formed from a photoresist composition, a carbon based-material such as amorphous carbon, or the like.

In the etching step, an atmosphere containing at least the second processing gas is provided inside the processing vessel, plasma is generated by a common method such as by glow discharge in the same way as in the deposition step, reactive species are generated from the noble gas that is a main component of the second processing gas, and a surface reaction between these reactive species and an active film formed on the processing subject substrate in the deposition step is carried out. Note that in a case in which the upper electrode of a parallel plate plasma generator is 60 MHz, the lower electrode of the parallel plate plasma generator is 2 MHz, and the separation between these electrodes is 35 mm, voltage applied to the lower electrode on which the processing subject substrate is placed preferably has a peak-to-peak value of 1,600 V or less. This is preferable because setting the aforementioned voltage as not more than the upper limit set forth above enables further improvement of etching selectivity ratio. Voltage applied to a lower electrode is preferably not more than the upper limit set forth above in the case of a parallel plate plasma generator, whereas voltage applied to a region at a side of the processing subject substrate at which the thin film is not formed is preferably not more than the upper limit set forth above in the case of other types of plasma generators.

(Step Switching)

A feature of the presently disclosed plasma etching method is that the deposition step and the etching step are switched between and implemented alternately. It is possible to switch from the deposition step to the etching step by stopping the supply of the first processing gas into the processing vessel. This mode of switching is also referred to as a "gas pulse method". Moreover, it is possible to switch from the deposition step to the etching step by increasing the voltage applied to the lower electrode (i.e., the voltage applied to a region at a side of the processing subject substrate at which the thin film is not formed) relative to the voltage in the deposition step. This mode of switching is also referred to as a "bias pulse method". The following describes these two modes with reference to FIGS. 1A and 1B.

<Gas Pulse Method>

FIG. 1A is a schematic illustration of step switching by the gas pulse method. Processing time (s) is illustrated on the horizontal axis, supply rate of each gas (sccm) is illustrated on the left-hand side vertical axis, and voltage applied to the lower electrode (V) is illustrated on the right-hand side vertical axis. For the sake of clarity of explanation, the first processing gas is taken to be a gas composed only of a noble gas and a first fluorocarbon gas, and the second processing gas is taken to be a gas composed only of a noble gas.

First, supply of the first and second processing gases at specific flow rates starts from a point $t_0$ (s) when the preparation step ends and the deposition step starts. In addition, supply of sufficient power to the upper electrode for causing glow discharge and generating plasma starts, and application of a specific voltage to the lower electrode starts (step a-0). The supply of the first processing gas stops at a point $t_{a-1}$ (s) (step a-1) and restarts at a point $t_{a-2}$ (s) (step a-2). Step (a-1) and step (a-2) are repeated until the etching depth reaches the desired depth. Steps (a-0) and (a-2) in which the first processing gas is supplied are steps corresponding to the deposition step set forth above; a thin film is formed on the processing subject substrate in these steps. On the other hand, step (a-1) in which the first processing gas is not supplied into the processing vessel and in which the inside of the processing vessel is substantially filled by the second processing gas composed only of a noble gas is a step corresponding to the etching step set forth above; the processing subject substrate is plasma etched in this step. By changing the supply state of the first processing gas in a pulse-like manner as described above, the atmosphere inside the processing vessel can be changed in a pulse-like manner, and the deposition step and the etching step can be switched between.

The atmosphere inside the processing vessel during the etching step contains at least the second processing gas. In the gas pulse method, the supply of the first processing gas stops at the point $t_{a-1}$ (s) as previously explained. Therefore, the concentration of the first processing gas in the atmosphere inside the processing vessel gradually decreases from the start point of the etching step as the etching step proceeds. Although no specific limitations are placed on the lower limit of the content ratio of the first processing gas in the atmosphere inside the processing vessel while the etching step is proceeding, the lower limit may, for example, be 0 volume % or substantially 0 volume %. The phrase "substantially 0 volume %" as used in the present specification means that the first processing gas is not substantially contained in the processing vessel and, more specifically, means that the concentration of the first processing gas inside the processing vessel is less than 1.00%.

<Bias Pulse Method>

Figure 1B:
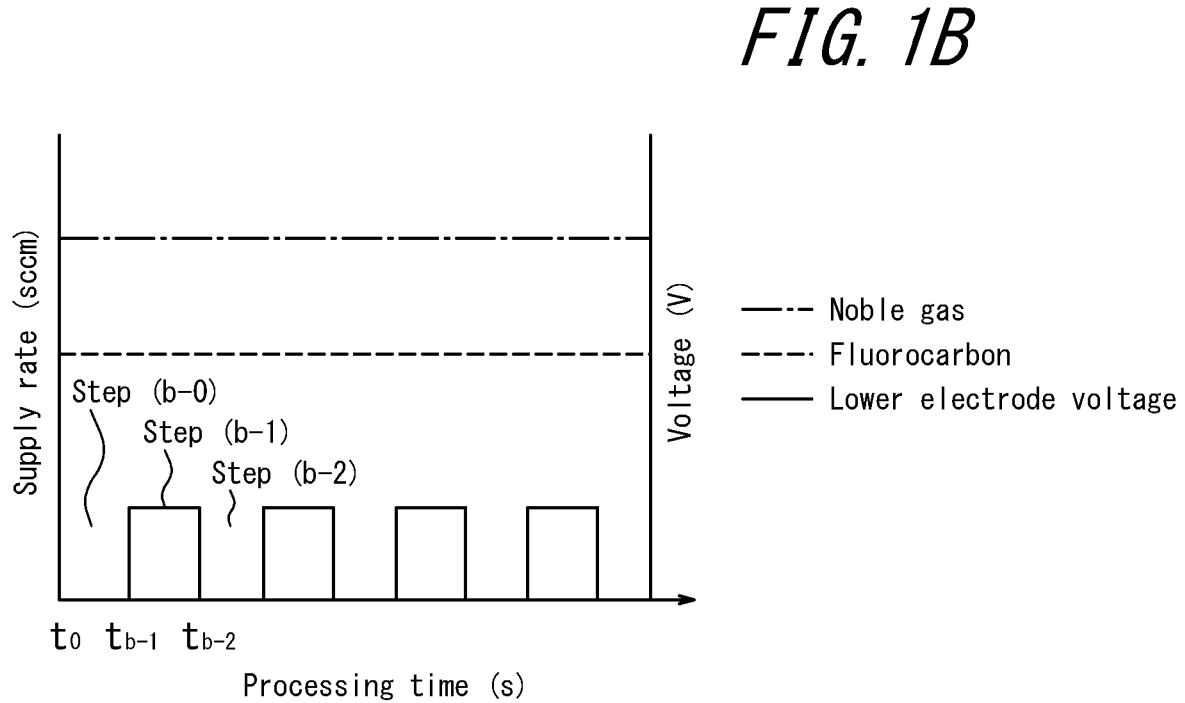
FIG. 1B illustrates variation of various gases and voltage in switching between a deposition step and an etching step by a bias pulse method.

FIG. 1B is a schematic illustration of step switching by the bias pulse method. The axes of FIG. 1B are the same as those in FIG. 1A. Moreover, a case is described in which the gases are the same as those for FIG. 1A. First, supply of the first and second processing gases at specific flow rates starts at a point $t_0$ (s) when the preparation step ends and the deposition step starts (step b-0). In addition, supply of sufficient power to the upper electrode for causing glow discharge and generating plasma starts in the same manner as in FIG. 1A. Application of voltage to the lower electrode starts at a point $t_{b-1}$ (s) (step b-1) and stops at a point $t_{b-2}$ (s) (step b-2). Step (b-1) and step (b-2) are repeated until the etching depth reaches the desired depth. Steps (b-0) and (b-2) in which voltage is not applied to the lower electrode are steps corresponding to the deposition step set forth above, whereas step (b-1) in which voltage is applied to the lower electrode is a step corresponding to the etching step set forth above. Although FIG. 1B illustrates a case in which voltage is not applied in steps (b-0) and (b-2), a lower voltage than in step (b-1) may be applied to the lower electrode in steps (b-0) and (b-2) as previously explained. Note that the atmosphere inside the processing vessel remains roughly constant through the deposition step and the etching step in the bias pulse method.

Moreover, the gas pulse method and the bias pulse method set forth above may be implemented in combination. In other words, a configuration may be adopted in which voltage is not applied to the lower electrode or is reduced while the first processing gas is supplied and in which voltage applied to the lower electrode is increased while supply of the first processing gas is stopped.

EXAMPLES

The following provides a more specific description of the present disclosure based on examples. However, the present disclosure is not limited to the following examples. In the examples and comparative examples, the content ratio of fluorine atoms and carbon atoms in a first processing gas, film thicknesses, etching depths, and etching selectivity ratios were measured and evaluated as described below.

<Content Ratio of Fluorine Atoms and Carbon Atoms>

In the examples and comparative examples, the content ratio of fluorine atoms and carbon atoms in first and second processing gases was taken to be the theoretical value for the content ratio of fluorine atoms and carbon atoms in a used fluorocarbon gas (i.e., a value obtained by dividing the molar mass of fluorine atoms in the compound by the molar mass of carbon atoms in the compound). Note that in a case in which the second processing gas does not contain fluorine atoms and carbon atoms and in which a single gas is used as the first processing gas as in the examples and comparative examples, the theoretical value corresponds to the content ratio of fluorine atoms and carbon atoms in an atmosphere inside a processing vessel.

<Film Thickness and Etching Depth>

[Film Thickness]

In the examples and comparative examples, the deposition step time and the etching step time were varied, and a commercially available ellipsometry film thickness meter was used to measure the film thickness of 1 to 3 points with respect to each processing target film and non-processing target film. A plot of deposition step time or etching step time on a horizontal axis and film thickness on a vertical axis was prepared from the obtained measurement values, a linear approximation was obtained, and the film thickness at each time was calculated.

[Etching Depth]

In the examples and comparative examples, the thickness of each film directly after a deposition step and the thickness of each film directly after an etching step of a specific time were measured as described above. Moreover, the value for the thickness of each film in the processing subject substrate after each type of processing was subtracted from the value for the thickness of each film in the processing subject substrate before implementation of the processing. The obtained difference value was taken to be the value of the etching depth at the corresponding point in time. Note that in a case in which the film thickness value after each type of processing is larger than the film thickness value before the processing, the value for the etching depth is a negative value. In such a case, the film thickness increases compared to before the processing, which, in other words, indicates that stacking of a thin film on the processing subject substrate occurs rather than etching. Conversely, in a case in which the film thickness value after each type of processing is smaller than the film thickness value before the processing, the value for the etching depth is a positive value. This indicates that the processing subject substrate has been etched.

<Etching Selectivity Ratio>

An etching selectivity ratio is ideally evaluated by forming a structure on the order of angstroms (normally less than 20 angstroms), which is the level required in actual products. However, in calculation of an etching selectivity ratio through actual measurement of a structure that is smaller than 20 angstroms, it may not be possible to accurately evaluate the etching selectivity ratio because the measurement accuracy of the measurement apparatus has an excessively large influence. Therefore, in the present specification, the rate of film formation and etching rate of each film was calculated under evaluation conditions that were slightly larger in size than the normal target scale in ALE. Based on the obtained values, the times required for the deposition step and the etching step, the etching depth of each film, and etching selectivity ratios were calculated and evaluated for a case in which a structure of the target angstrom-order is formed.

[Film Formation Rate]

Specifically, a deposition step was first implemented under the conditions described for each example and comparative example to form a thin film of 97 angstroms to 163 angstroms in thickness. At a point after the deposition step ended and before an etching step started (i.e., a point at an etching time of 0 s), the thickness of each film (angstroms) was measured in accordance with the previously described method and the obtained thickness of the film was divided by the deposition step time (s) to calculate the rate of formation (angstroms/s) of the film (Table 2).

[Etching Rate]

The etching depth (angstroms) was measured by the previously described method at multiple points after the start of the etching step. A linear approximation was obtained from a plot of etching depth and etching time, and the gradient of the linear approximation was taken to be the etching rate of the corresponding film (Table 2).

[Etching Selectivity Ratio for Each Etching Depth]

The thickness of an active film formed in a deposition step was taken to be 5 angstroms, and then 5 angstroms was divided by the rate of formation (angstroms/s) of the active film to calculate the time $t_d$ required for the deposition step. Moreover, a desired etching depth (for example, 10 angstroms, 15 angstroms, or 20 angstroms) was presumed for a silicon oxide film that was a processing target film, and this etching depth (angstroms) was divided by the etching rate (angstroms/s) of the silicon oxide film to calculate the time $t_e$ required for the etching step. The etching depth of a silicon nitride film was calculated by equation 1: (Formation rate of silicon nitride film (angstroms/s)×Time $t_d$ required for deposition step)−(Etching rate of silicon nitride film (angstroms/s)×Time $t_e$ required for etching step). The etching depth of a photoresist was calculated in the same manner from equation 2: (Formation rate of photoresist (angstroms/s)×Time $t_d$ required for deposition step)−(Etching rate of photoresist (angstroms/s)×Time $t_e$ required for etching step).

In each case in which the calculated etching depth of a non-processing target film was more than zero, an etching selectivity ratio was calculated by dividing the value for the etching depth of the processing target silicon oxide film by the value for the etching depth of the non-processing target film. On the other hand, in each case in which the etching depth of a non-processing target film was zero or less (i.e., in a case in which the film was not etched at all or in which the thickness of the film after etching was larger than before etching), the etching selectivity ratio was evaluated as being infinitely large.

Example 1

<Apparatus Configuration>

A processing vessel including a parallel plate plasma generator was used. The parallel plate plasma generator included an upper electrode and a lower electrode on which a processing subject substrate was placed. The separation between a lower surface of the upper electrode and an upper surface of the lower electrode was 35 mm. Moreover, the frequency of the upper electrode of the parallel plate plasma generator was 60 MHz and the frequency of the lower electrode of the parallel plate plasma generator was 2 MHz. The lower electrode included a cooling unit that was configured to cool the lower electrode through contacting of helium gas with the lower electrode. Note that the cooling unit was configured such that helium gas did not leak into the processing vessel.

<Preparation Step>

A silicon substrate piece serving as a processing subject substrate that included a silicon oxide film ($SiO_2$ film) as a processing target film, a silicon nitride film (SiN film) as a non-processing target film, and a photoresist film for an ArF excimer laser (denoted as "PR film" in the tables; formed using AR414 produced by JSR Corporation) as a non-processing target film was introduced into the processing vessel including the parallel plate plasma generator and was subjected to plasma etching under the plasma conditions described below. The cooling unit was set at a temperature of 60° C. and the gas pressure of helium gas was set as 1,000 Pa.

<Deposition Step>

Next, 150 W of power was supplied to the upper electrode and voltage was applied to the lower electrode such as to have a peak-to-peak value (Vpp) of 100 V. 1,2,3,3,4,4,5,5-Octafluorocyclopentene gas (hereinafter, also referred to as "$C_5F_8$ gas" for simplicity) as a first processing gas and argon gas were supplied into the processing vessel. The supply flow rates thereof were 10 sccm of $C_5F_8$ gas and 200 sccm of argon gas. In other words, an atmosphere in which 2,000 parts by volume of argon gas were present per 100 parts by volume of $C_5F_8$ gas was provided inside the processing vessel. The pressure inside the processing vessel was set as 2.6 Pa. The voltage and first processing gas conditions described above were maintained for 10 s, the inside of the processing vessel was placed in a plasma state, and a deposition step was implemented. In the deposition step, a thin film was formed on the silicon substrate piece (processing subject substrate). Note that the formed thin film can function as a protective film or an active film in a subsequent step (etching step). A value for the thickness of each film in the processing subject substrate straight after the deposition step was measured in accordance with the previously described method. The results are shown in Table 1.

<Etching Step>

The supply of $C_5F_8$ gas was stopped 10 s after the supply of the first processing gas was started. A state in which other conditions were maintained was held for a specific time and an etching step was implemented. A value for the thickness of each film in the processing subject substrate was measured in accordance with the previously described method for etching times of 30 s, 90 s, and 150 s. The results are shown in Table 1.

Moreover, the rate of formation and etching rate of each film were calculated from the obtained film thickness values for the film, the deposition step time, and the etching step time such as are shown in Table 1. The calculated results are shown in Table 2. Table 3-1 shows values calculated for the times of the deposition step and the etching step, the total time thereof (i.e., the processing time), the etching depth of each film, and selectivity ratios that were presumed for when the thickness of the active film formed in the deposition step was taken to be 5 angstroms and the etching depth of the silicon oxide film was taken to be 10 angstroms. In the same manner, Tables 3-2 and 3-3 shown values calculated for the same categories as in Table 3-1 when the etching depth of the silicon oxide film was changed to 15 angstroms and when the etching depth of the silicon oxide film was changed to 20 angstroms.

Example 2

Plasma etching was performed in the same way as in Example 1 with the exception that in Example 1, the voltage applied to the lower electrode was changed such as to have a peak-to-peak value (Vpp) of 1,600 V, the deposition step time was changed to 30 s, and the etching times were changed to 30 s, 60 s, 90 s, and 120 s. The results are shown in Table 1. Various calculated values obtained from the data in Table 1 are shown in Table 2 and Tables 3-1 to 3-3.

Comparative Example 1

Plasma etching was performed in the same way as in Example 1 with the exception that the first processing gas was changed to 1,1,2,3,4,4-hexafluoro-1,3-butadiene ($C_4F_6$) and the deposition step time was changed to 6 s. The results are shown in Table 1. Various calculated values obtained from the data in Table 1 are shown in Table 2 and Tables 3-1 to 3-3.

Comparative Example 2

Plasma etching was performed in the same way as in Comparative Example 1 with the exception that the voltage applied to the lower electrode was changed such as to have a peak-to-peak value (Vpp) of 1,600 V, the deposition step time was changed to 17 s, and the etching times were changed to 30 s, 60 s, 90 s, and 120 s. The results are shown in Table 1. Various calculated values obtained from the data in Table 1 are shown in Table 2 and Tables 3-1 to 3-3.

Comparative Example 3

Plasma etching was performed in the same way as in Example 1 with the exception that the first processing gas was changed to 1,3,3,4,4,5,5-heptafluorocyclopentene ($C_5HF_7$) and the deposition step time was changed to 4 s. The results are shown in Table 1. Various calculated values obtained from the data in Table 1 are shown in Table 2 and Tables 3-1 to 3-3.

Comparative Example 4

Plasma etching was performed in the same way as in Comparative Example 3 with the exception that the voltage applied to the lower electrode was changed such as to have a peak-to-peak value (Vpp) of 1,600 V, the deposition step time was changed to 6 s, and the etching times were changed to 30 s, 60 s, 90 s, and 120 s. The results are shown in Table 1. Various calculated values obtained from the data in Table 1 are shown in Table 2 and Tables 3-1 to 3-3.

Comparative Example 5

A deposition step was started in the same way as in Example 1 with the exception that the first processing gas was changed to octafluorocyclobutane ($C_4F_8$). However, each film was not formed in the deposition step as shown in Tables 1 and 2. Rather, etching of the silicon oxide film, the silicon nitride film, and the photoresist proceeded in the deposition step and thus it was not possible to perform etching by ALE.

Comparative Example 6

A deposition step was started in the same way as in Comparative Example 5 with the exception that the voltage applied to the lower electrode was changed such as to have a peak-to-peak value (Vpp) of 1,600 V. However, each film was not formed in the deposition step as shown in Tables 1 and 2. Rather, etching of the silicon oxide film, the silicon nitride film, and the photoresist proceeded in the deposition step and thus it was not possible to perform etching by ALE.

TABLE 1

| | Deposition step | | | | | | Etching step | | | | |
|---|---|---|---|---|---|---|---|---|---|---|---|
| | First processing gas Fluorocarbon gas | | | Second processing gas | | | | | | | |
| | | | Content | Noble gas | | | Etching | | | | |
| | | | [parts | | Content | Lower | Deposition | Lower | step | Etching depth [angstroms] | | |
| | Type | F/C ratio (by mass) | by volume] | Type | [parts by volume] | voltage [V] | step time [s] | voltage [V] | time [s] | $SiO_2$ film [angstroms] | SiN film [angstroms] | PR film [angstroms] |
| Example 1 | $C_5F_8$ | 2.53 | 100 | Ar | 2000 | 100 | 10 | 100 | 0 | −103 | −134 | −104 |
| | | | | | | | | | 30 | 0 | −50 | −4 |
| | | | | | | | | | 90 | 134 | −21 | −3 |
| | | | | | | | | | 150 | 309 | 36 | 41 |
| Example 2 | $C_5F_8$ | 2.53 | 100 | Ar | 2000 | 1600 | 30 | 1600 | 0 | −131 | −282 | −131 |
| | | | | | | | | | 30 | 13 | −69 | −1 |
| | | | | | | | | | 60 | 256 | 21 | 36 |
| | | | | | | | | | 90 | 413 | 90 | 142 |
| | | | | | | | | | 120 | 548 | 156 | 227 |
| Comparative Example 1 | $C_4F_6$ | 2.37 | 100 | Ar | 2000 | 100 | 6 | 100 | 0 | −97 | −181 | −77 |
| | | | | | | | | | 30 | −14 | 9 | −14 |
| | | | | | | | | | 90 | 150 | 47 | 7 |
| | | | | | | | | | 150 | 271 | 138 | 43 |
| Comparative Example 2 | $C_4F_6$ | 2.37 | 100 | Ar | 2000 | 1600 | 17 | 1600 | 0 | −163 | −270 | −155 |
| | | | | | | | | | 30 | −88 | −132 | −42 |
| | | | | | | | | | 60 | 4 | −35 | −3 |
| | | | | | | | | | 90 | 223 | 16 | 23 |
| | | | | | | | | | 120 | 371 | 72 | 131 |
| Comparative Example 3 | $C_5HF_7$ | 2.21 | 100 | Ar | 2000 | 100 | 4 | 100 | 0 | −106 | −136 | −87 |
| | | | | | | | | | 30 | −138 | −154 | −103 |
| | | | | | | | | | 90 | −73 | −95 | −33 |
| | | | | | | | | | 150 | −76 | −89 | −24 |
| Comparative Example 4 | $C_5HF_7$ | 2.21 | 100 | Ar | 2000 | 1600 | 6 | 1600 | 0 | −124 | −168 | −97 |
| | | | | | | | | | 30 | −56 | −85 | −35 |
| | | | | | | | | | 60 | 55 | −51 | −2 |
| | | | | | | | | | 90 | 268 | 34 | 60 |
| | | | | | | | | | 120 | 420 | 157 | 194 |
| Comparative Example 5 | $C_4F_8$ | 3.16 | 100 | Ar | 2000 | 100 | Not formed | — | | | | |
| Comparative Example 6 | $C_4F_8$ | 3.16 | 100 | Ar | 2000 | 1600 | Not formed | — | | | | |

TABLE 2

|  | Film formation rate [angstroms/s] | | | Etching rate [angstroms/s] | | |
| --- | --- | --- | --- | --- | --- | --- |
|  | Active film | On SiN film | On PR film | SiO$_2$ film [angstroms/s] | SiN film [angstroms/s] | PR film [angstroms/s] |
| Example 1 | 8.8 | 9.6 | 9.2 | 2.7 | 1.0 | 0.8 |
| Example 2 | 4.9 | 7.9 | 5.2 | 5.9 | 3.4 | 2.9 |
| Comparative Example 1 | 15 | 15 | 16 | 2.5 | 1.8 | 0.7 |
| Comparative Example 2 | 11 | 13 | 10 | 4.1 | 2.8 | 2.1 |
| Comparative Example 3 | 22 | 25 | 21 | Etching does not proceed | | |
| Comparative Example 4 | 22 | 24 | 21 | 4.2 | 2.6 | 2.3 |
| Comparative Example 5 | Not formed | Not formed | Not formed |  |  |  |
| Comparative Example 6 | Not formed | Not formed | Not formed |  |  |  |

(Case in which active film thickness is 5 angstroms and silicon oxide film etching depth is 10 angstroms)

TABLE 3-1

|  | Type of first processing gas | F/C ratio of first processing gas (by mass) | Lower voltage [V] | Presumed deposition step time [s] | Presumed etching step time [s] | Presumed total processing time [s] | Presumed etching depth of SiN film [angstroms] | Presumed etching depth of PR film [angstroms] | Selectivity ratio (SiO$_2$/SiN) | Selectivity ratio (SiO$_2$/PR) |
| --- | --- | --- | --- | --- | --- | --- | --- | --- | --- | --- |
| Example 1 | C$_5$F$_8$ | 2.53 | 100 | 0.6 | 5.6 | 6.1 | 0.1 | −0.8 | 99.0 | ∞ |
| Example 2 | C$_5$F$_8$ | 2.53 | 1600 | 1.0 | 2.5 | 3.6 | 0.6 | 2.1 | 17.2 | 4.8 |
| Comparative Example 1 | C$_4$F$_6$ | 2.37 | 100 | 0.3 | 6.0 | 6.3 | 5.8 | −1.1 | 1.7 | ∞ |
| Comparative Example 2 | C$_4$F$_6$ | 2.37 | 1600 | 0.5 | 3.7 | 4.1 | 4.3 | 3.1 | 2.3 | 3.2 |
| Comparative Example 3 | C$_5$HF$_7$ | 2.21 | 100 | 0.2 | Etching does not proceed | | | | | |
| Comparative Example 4 | C$_5$HF$_7$ | 2.21 | 1600 | 0.2 | 3.6 | 3.8 | 3.8 | 3.4 | 2.6 | 2.9 |
| Comparative Example 5 | C$_4$F$_8$ | 3.16 | 100 | Active film and protective film not formed | | | | | | |
| Comparative Example 6 | C$_4$F$_8$ | 3.16 | 1600 | Active film and protective film not formed | | | | | | |

(Case in which active film thickness is 5 angstroms and silicon oxide film etching depth is 15 angstroms)

TABLE 3-2

|  | Type of first processing gas | F/C ratio of first processing gas (by mass) | Lower voltage [V] | Presumed deposition step time [s] | Presumed etching step time [s] | Presumed total processing time [s] | Presumed etching depth of SiN film [angstroms] | Presumed etching depth of PR film [angstroms] | Selectivity ratio (SiO$_2$/SiN) | Selectivity ratio (SiO$_2$/PR) |
| --- | --- | --- | --- | --- | --- | --- | --- | --- | --- | --- |
| Example 1 | C$_5$F$_8$ | 2.53 | 100 | 0.6 | 7.4 | 8.0 | 2.0 | 0.7 | 7.7 | 21.5 |
| Example 2 | C$_5$F$_8$ | 2.53 | 1600 | 1.0 | 3.4 | 4.4 | 3.5 | 4.5 | 4.3 | 3.3 |
| Comparative Example 1 | C$_4$F$_6$ | 2.37 | 100 | 0.3 | 8.0 | 8.3 | 9.4 | 0.3 | 1.6 | 56 |
| Comparative Example 2 | C$_4$F$_6$ | 2.37 | 1600 | 0.5 | 4.9 | 5.3 | 7.7 | 5.7 | 1.9 | 2.6 |
| Comparative Example 3 | C$_5$HF$_7$ | 2.21 | 100 | 0.2 | Etching does not proceed | | | | | |
| Comparative Example 4 | C$_5$HF$_7$ | 2.21 | 1600 | 0.2 | 4.8 | 5.0 | 6.9 | 6.2 | 2.2 | 2.4 |
| Comparative Example 5 | C$_4$F$_8$ | 3.16 | 100 | Active film and protective film not formed | | | | | | |
| Comparative Example 6 | C$_4$F$_8$ | 3.16 | 1600 | Active film and protective film not formed | | | | | | |

(Case in which active film thickness is 5 angstroms and silicon oxide film etching depth is 20 angstroms)

Example 1 and an adequate etching selectivity ratio is not obtained. On the other hand, the etching selectivity ratio of

TABLE 3-3

| | Type of first processing gas | F/C ratio of first processing gas (by mass) | Lower voltage [V] | Presumed deposition step time [s] | Presumed etching step time [s] | Presumed total processing time [s] | Presumed etching depth of SiN film [angstroms] | Presumed etching depth of PR film [angstroms] | Selectivity ratio ($SiO_2$/SiN) | Selectivity ratio ($SiO_2$/PR) |
|---|---|---|---|---|---|---|---|---|---|---|
| Example 1 | $C_5F_8$ | 2.53 | 100 | 0.6 | 9.3 | 9.8 | 3.8 | 2.2 | 5.3 | 9.2 |
| Example 2 | $C_5F_8$ | 2.53 | 1600 | 1.0 | 4.2 | 5.3 | 6.3 | 7.0 | 3.2 | 2.9 |
| Comparative Example 1 | $C_4F_6$ | 2.37 | 100 | 0.3 | 10.0 | 10.3 | 13.0 | 1.7 | 1.5 | 12 |
| Comparative Example 2 | $C_4F_6$ | 2.37 | 1600 | 0.5 | 6.1 | 6.6 | 11.2 | 8.3 | 1.8 | 2.4 |
| Comparative Example 3 | $C_5HF_7$ | 2.21 | 100 | 0.2 | Etching does not proceed | | | | | |
| Comparative Example 4 | $C_5HF_7$ | 2.21 | 1600 | 0.2 | 6.0 | 6.2 | 10.0 | 8.9 | 2.0 | 2.2 |
| Comparative Example 5 | $C_4F_8$ | 3.16 | 100 | Active film and protective film not formed | | | | | | |
| Comparative Example 6 | $C_4F_8$ | 3.16 | 1600 | Active film and protective film not formed | | | | | | |

It can be seen from Tables 3-1 to 3-3 that in a plasma etching method according to the present disclosure in which a deposition step and an etching step are switched between and implemented alternately and in which a first processing gas containing at least 2.4 times and not more than 3.1 times more fluorine atoms than carbon atoms by mass is used, it is possible to both shorten processing time and improve etching selectivity ratio. For example, when Example 1 and Comparative Example 1 in which the voltage applied to the lower electrode is the same are compared with reference to Table 3-1, despite the processing time being slightly shorter in Example 1, the etching selectivity ratio of a silicon oxide film (processing target film) relative to non-processing target films such as a silicon nitride film and a photoresist is sufficiently high, and thus shortening of processing time and improvement of etching selectivity ratio are achieved in a good balance. Moreover, it can be seen that although the etching selectivity ratio of a silicon oxide film relative to a photoresist is excellent ("∞" evaluation) in both Example 1 and Comparative Example 1, the selectivity ratio relative to a silicon nitride film is at least 50 times better in Example 1 than in Comparative Example 1.

Next, Example 1 and Comparative Example 1 are compared and considered with reference to Table 3-2 for a case in which the etching depth is taken to be 15 angstroms. Firstly, the processing time is shorter in Example 1. Moreover, although the etching selectivity ratio of a silicon oxide film relative to a photoresist is sufficiently high in both Example 1 and Comparative Example 1, the etching selectivity ratio of a silicon oxide film relative to a silicon nitride film has a low value of 1.6 in Comparative Example 1 and an adequate etching selectivity ratio is not obtained. On the other hand, the etching selectivity ratio of a silicon oxide film relative to a silicon nitride film in Example 1 has a sufficiently high value of 7.7.

Next, Example 1 and Comparative Example 1 are compared and considered with reference to Table 3-3 for a case in which the etching depth is taken to be 20 angstroms. Firstly, the processing time is once again shorter in Example 1. Moreover, although the etching selectivity ratio of a silicon oxide film relative to a photoresist has a sufficiently high value in both Example 1 and Comparative Example 1, the etching selectivity ratio of a silicon oxide film relative to a silicon nitride film has a low value of 1.5 in Comparative Example 1 and an adequate etching selectivity ratio is not obtained. On the other hand, the etching selectivity ratio of a silicon oxide film relative to a silicon nitride film in Example 1 has a sufficiently high value of 5.3.

The same trends as described above are observed for Example 2 and Comparative Examples 2, 4, and 6 in which the supplied voltage to the lower electrode has a peak-to-peak value (Vpp) of 1,600 V.

Furthermore, as shown by Tables 1 and 2, particularly in Comparative Examples 5 and 6 in which a first processing gas that includes 3.16 times more fluorine atoms than carbon atoms by mass is used, an active film and a protective film are not formed. This is presumed to be because plasma polymerization does not readily proceed in the deposition step in a situation in which more than 3.1 times more fluorine atoms than carbon atoms by mass are included, which makes application in ALE difficult. Moreover, as shown in Tables 1 and 2, although an active film and a protective film on the silicon nitride film and the photoresist are formed in Comparative Example 3 in which a first processing gas including 2.21 times more fluorine atoms than carbon atoms by mass is used, etching almost stops in the etching step. This is presumed to be due to the ratio of carbon atoms in the first processing gas being comparatively high, which leads to a high carbon ratio in the atomic composition of the formed active film and increased etching resistance of the active film.

Table 4 shows, as reference examples, results for cases in which a conventional plasma etching method in which a deposition step and an etching step were not switched between was implemented using each of the fluorocarbon gases used in the examples and comparative examples. Note that results for cases in which the same gases were used in a plasma etching method according to the present disclosure are taken from Table 3-1 and shown together with the results of the reference examples. Moreover, in order allow comparison with the etching rate by the conventional plasma etching method, a value obtained by dividing the presumed etching depth of 10 angstroms by the presumed processing time in Table 3-1 is taken to be the "presumed processing rate" in Table 4.

Note that values for the power supplied to the upper electrode and the voltage applied to the lower electrode in the following reference examples differ from those in Comparative Example 3. This is because adjustment was performed to values for obtaining good etching results by the conventional plasma etching method.

Reference Example 1

A typical conventional etching method in which a deposition step and an etching step proceeded concurrently was implemented by adding, as processing gases, 100 parts by volume of 1,3,3,4,4,5,5-heptafluorocyclopentene ($C_5HF_7$) gas, 2,000 parts by volume of a noble gas, and 300 parts by volume of oxygen gas (amount that provides the maximum etching rate), setting power supplied to the upper electrode as 600 W, and setting a peak-to-peak value (Vpp) of voltage of the lower electrode as 4,700 V. The results are shown in Table 4.

Reference Example 2

A typical conventional etching method in which a deposition step and an etching step proceeded concurrently was implemented by adding, as processing gases, 100 parts by volume of 1,1,2,3,4,4-hexafluoro-1,3-butadiene ($C_4F_6$) gas, 2,000 parts by volume of a noble gas, and 200 parts by volume of oxygen gas (amount that provides the maximum etching rate), and setting a peak-to-peak value (Vpp) of voltage applied to the lower electrode as 4,700 V. The results are shown in Table 4.

Reference Example 3

A typical conventional etching method in which a deposition step and an etching step proceeded concurrently was implemented by adding, as processing gases, 100 parts by volume of 1,2,3,3,4,4,5,5-octafluorocyclopentene ($C_5F_8$) gas, 2,000 parts by volume of a noble gas, and 150 parts by volume of oxygen gas (amount that provides the maximum etching rate), and setting a peak-to-peak value (Vpp) of voltage applied to the lower electrode as 4,700 V. The results are shown in Table 4.

Reference Example 4

A typical conventional etching method in which a deposition step and an etching step proceeded concurrently was implemented by adding, as processing gases, 100 parts by volume of octafluorocyclobutane ($C_4F_8$) gas and 2,000 parts by volume of a noble gas, and setting a peak-to-peak value (Vpp) of voltage applied to the lower electrode as 4,700 V. The results are shown in Table 4.

In Reference Examples 1 to 4, no relationship between the ratio (by mass) of fluorine atoms and carbon atoms in the first processing gas and the etching rate or etching selectivity ratio can be seen from Table 4. In contrast, a high etching selectivity ratio and a fast processing rate can both be achieved when $C_5F_8$ gas is used in ALE as shown by the right-hand side columns of Table 4.

In general, in plasma etching using a fluorocarbon as a processing gas, etching of a photoresist proceeds by fluorine radicals generated in fluorocarbon plasma and fluorine atoms in a fluorocarbon film deposited on the photoresist reacting with carbon atoms contained in the photoresist to produce volatile $CF_4$ that is discharged out of the system. On the other hand, etching of monocrystalline silicon or polysilicon proceeds by exactly the same principle through production of volatile $SiF_4$. In other words, when a high etching selectivity ratio relative to a photoresist can be obtained in the present disclosure, it is anticipated that a high etching selectivity ratio relative to silicon will also be obtained in the same manner.

A description of the present disclosure has been provided above based on illustrative embodiments and examples. However, the plasma etching method according to the present disclosure is not limited by a specific apparatus configuration or specific etching conditions. Any apparatus configuration and etching conditions may be adopted in the presently disclosed plasma etching method so long as it is possible to achieve processing time shortening and etching selectivity ratio improvement in a plasma etching method by ALE through setting of the mass ratio of fluorine atoms and carbon atoms contained in processing gases within a specific range.

INDUSTRIAL APPLICABILITY

According to the present disclosure, it is possible to provide a plasma etching method by ALE that can both shorten processing time and improve etching selectivity ratio.

The invention claimed is:
1. A plasma etching method comprising:
   a step of placing a processing subject substrate inside a processing vessel;
   a deposition step of supplying, into the processing vessel, a first processing gas that includes at least one gas including either or both of a fluorine atom and a carbon atom and a second processing gas, differing from the first processing gas, that has a noble gas as a main

TABLE 4

| | First processing gas | | Lower | Typical conventional etching method | | | Corresponding example/ comparative example | ALE | | |
|---|---|---|---|---|---|---|---|---|---|---|
| | | | | | | | | Presumed | | |
| | Type | F/C ratio (by mass) | voltage [V] | Etching rate [angstroms/s] | Selectivity ratio ($SiO_2$/SiN) | Selectivity ratio ($SiO_2$/PR) | | processing rate [angstroms/s] | Selectivity ratio ($SiO_2$/SiN) | Selectivity ratio ($SiO_2$/PR) |
| Reference Example 1 | $C_5HF_7$ | 2.21 | 4700 | 57 | 9.6 | 3.6 | Comparative Example 3 | Etching does not proceed | | |
| Reference Example 2 | $C_4F_6$ | 2.37 | 4700 | 53 | 5.7 | 2.1 | Comparative Example 2 | 2.4 | 2.3 | 3.2 |
| Reference Example 3 | $C_5F_8$ | 2.53 | 4700 | 54 | 7.8 | 2.1 | Example 2 | 2.8 | 17.2 | 4.8 |
| Reference Example 4 | $C_4F_8$ | 3.16 | 4700 | 56 | 7.9 | 4.1 | Comparative Example 6 | Active layer and protective layer not formed | | | component and may include a gas including either or both of a fluorine atom and a carbon atom to provide an atmosphere containing the first processing gas and the second processing gas inside the processing vessel, and forming a thin film on at least one surface of the processing subject substrate; and an etching step of providing an atmosphere containing at least the second processing gas inside the processing vessel and plasma etching the processing subject substrate on which the thin film has been formed, wherein the deposition step and the etching step are switched between and implemented alternately, when an atmosphere containing the first processing gas and the second processing gas is provided inside the processing vessel in the deposition step, the atmosphere is configured to contain at least 2.4 times and not more than 3.1 times more fluorine atoms than carbon atoms by mass, the first processing gas includes at least octafluorocyclopentene gas, supply of the first processing gas into the processing vessel is stopped in switching from the deposition step to the etching step, and when an atmosphere containing the first processing gas and the second processing gas is provided inside the processing vessel in the deposition step, a ratio of the noble gas in the atmosphere is set as at least 10 parts by volume and not more than 10,000 parts by volume relative to 100 parts by volume of all gases including either or both of a fluorine atom and a carbon atom in the atmosphere.

2. The plasma etching method according to claim 1, wherein
voltage applied to a region inside the processing vessel at a side of the processing subject substrate at which the thin film is not formed is increased in the etching step relative to voltage applied to the same region in the deposition step.

3. The plasma etching method according to claim 1, wherein
in the etching step, voltage applied to a region at a side of the processing subject substrate at which the thin film is not formed has a peak-to-peak value of 1,600 V or less.

4. The plasma etching method according to claim 1, wherein
the processing subject substrate includes a non-processing target film and a processing target film, and an etching selectivity ratio of the processing target film relative to the non-processing target film is 3.5 or more.

5. The plasma etching method according to claim 1, wherein the noble gas is contained in a proportion of 99.00 volume % or more when the entire volume of the second processing gas is taken to be 100 volume %.

* * * * *